United States Patent [19]

Tanny

[11] Patent Number: 4,637,541
[45] Date of Patent: Jan. 20, 1987

[54] CIRCUIT BOARD SOLDERING DEVICE

[75] Inventor: Michael W. Tanny, Westminster, Calif.

[73] Assignee: Unit Industries, Inc., Fullerton, Calif.

[21] Appl. No.: 750,333

[22] Filed: Jun. 28, 1985

[51] Int. Cl.[4] .............................................. B23K 31/02
[52] U.S. Cl. .................................... 228/180.1; 228/36; 228/38; 228/40; 228/43; 118/423
[58] Field of Search .................. 228/180.1, 36, 38, 39, 228/40, 43; 118/423

[56] References Cited

U.S. PATENT DOCUMENTS

| | | |
|---|---|---|
| 2,671,264 | 3/1953 | Pessel . |
| 2,740,193 | 7/1953 | Pessel . |
| 2,770,875 | 9/1956 | Zimmerman . |
| 2,865,093 | 5/1957 | Ingram . |
| 2,872,625 | 2/1959 | Liebscher . |
| 2,884,612 | 4/1959 | Bang . |
| 2,964,007 | 12/1960 | Buffington . |
| 3,037,274 | 6/1962 | Hancock . |
| 3,039,185 | 6/1962 | Oates . |
| 3,041,991 | 6/1962 | Dvorak . |
| 3,053,215 | 9/1962 | Guty . |
| 3,092,059 | 6/1963 | Tesch ............................... 228/180.1 |
| 3,100,471 | 8/1963 | Gutbier . |
| 3,108,560 | 10/1963 | Bowne . |
| 3,112,723 | 12/1963 | Potocki . |
| 3,122,117 | 2/1964 | Marzullo et al. . |
| 3,135,630 | 6/1964 | Bielinski et al. . |
| 3,216,643 | 11/1965 | DeVerter . |
| 3,218,193 | 11/1965 | Isaacson . |
| 3,226,821 | 1/1966 | Van Dijk et al. . |
| 3,303,983 | 2/1967 | Patrick . |
| 3,386,166 | 6/1968 | Tardoskegyi . |
| 3,439,854 | 4/1969 | Walker . |
| 3,482,755 | 12/1969 | Raciti . |
| 3,532,262 | 10/1970 | Laubmeyer et al. . |
| 3,570,741 | 3/1971 | Corsaro et al. . |
| 3,588,998 | 6/1971 | Corsaro . |
| 3,604,611 | 9/1971 | Lamberty . |
| 3,680,762 | 8/1972 | Kondo . |
| 3,721,379 | 3/1973 | Corsaro . |
| 3,828,419 | 8/1974 | Wanner ............................ 228/36 |
| 4,009,816 | 3/1977 | Feuchtbaum et al. . |
| 4,090,654 | 5/1978 | Volkert . |
| 4,180,199 | 12/1979 | O'Rourke et al. . |
| 4,284,225 | 8/1981 | Hess . |
| 4,285,457 | 8/1981 | Kondo . |
| 4,311,265 | 1/1982 | Kondo . |
| 4,311,266 | 1/1982 | Kondo ............................... 228/180.1 |
| 4,363,434 | 12/1982 | Flury ................................ 228/180.1 |
| 4,401,253 | 8/1983 | O'Rourke . |
| 4,402,448 | 9/1983 | O'Rourke . |
| 4,410,127 | 10/1983 | Bodewig . |
| 4,424,931 | 1/1984 | Lovrenich . |
| 4,469,716 | 9/1984 | Caratsch . |
| 4,512,508 | 4/1985 | Pachschwöll .................... 228/180.1 |
| 4,512,510 | 4/1985 | Kondo ............................. 228/180.1 |
| 4,530,457 | 7/1985 | Down . |

Primary Examiner—Nicholas P. Godici
Assistant Examiner—Samuel M. Heinrich
Attorney, Agent, or Firm—Christie, Parker & Hale

[57] ABSTRACT

A process for soldering circuit boards comprising the steps of:
(a) applying a solder flux coating to the solder side of a board;
(b) drying the flux on the board and preheating the solder side of the board by sequentially
  (i) directing a stream of warm gas over the solder side of the board,
  (ii) positioning the solder side of the board over a hot molten solder bath,
(c) soldering the solder junctions on the board by immersing the solder side of the board into the surface of the hot molten solder bath by sequentially
  (i) immersing a first edge of the board into the surface of the solder bath,
  (ii) lowering the remainder of the board into the surface of the solder bath,
  (iii) longitudinally moving the board in the solder bath, and
  (iv) lifting the board from the surface of the solder bath at an angle to the surface of the solder bath to drain excess hot molten solder from the board.

22 Claims, 15 Drawing Figures

Microfiche Appendix Included
(1 Microfiche, 15 Pages)

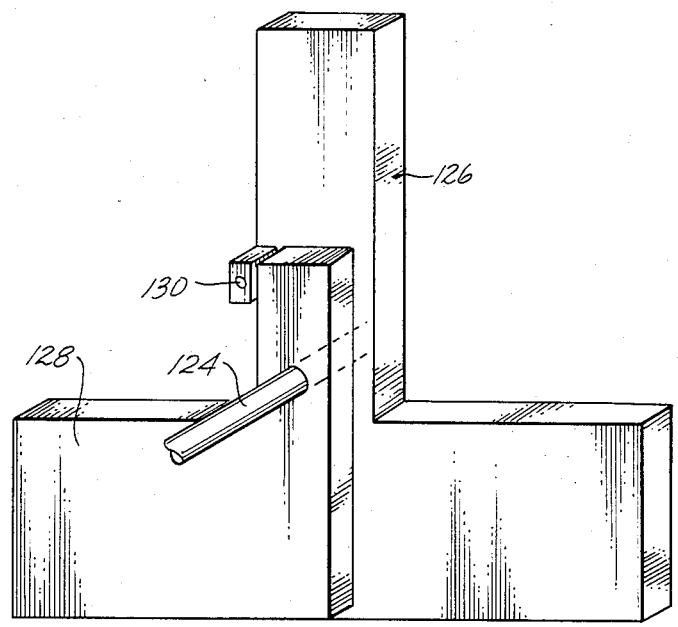

CIRCUIT BOARD SOLDERING DEVICE

The master resident program for one embodiment of the present device is set forth on the microfiche appendix composed of one microfiche and of fifteen frames.

FIELD OF THE INVENTION

The present invention is directed to a circuit board soldering process and an automatic soldering device for soldering conventional electronic components and SMDs to circuit boards.

BACKGROUND OF THE INVENTION

Circuit boards are either hand soldered or automatically soldered with an automatic soldering system, such as the systems manufactured by Zeva Electric Corporation, Electro-vert and the like. Typical automatic soldering machines include wave soldering machines and drag soldering machines. If the circuit board contains a large number of components, the components are usually soldered enmasse, after their placement on the board, in an automatic soldering machine. If heat or solvent sensitive components are to be included on the board, such components are usually hand soldered onto the board after the automatic soldering operation. The conventional automatic soldering machine, such as the Zeva brand soldering machines have a longitudinal frame including a flux coating stage, a drying and preheating stage, and a soldering stage. The boards are attached to a carrier carried by conveyer chains, or by a conveyor chain having integral fingers to carry circuit boards, that run the length of the longitudinal frame past each stage. A board is loaded into the machine at one end, carried to a flux coating stage wherein flux is applied to the solder side (underside) of the board, passed to the drying and preheating stage where the flux coating is dried and the board is preheated, and then immersed and transported across the surface of a hot molten solder bath or molten solder wave to complete the solder operation. The board is then deposited at the exit end of the machine.

Soldering machines of the type described above have seen extensive use. However, there are operational problems associated with these machines. If the boards inadvertently slip from the carrier or warp from the preheating, they frequently may jam in the machine and stop the conveyer chain. This often causes destruction of the board because the chain drives are powerful and can break or warp the jammed boards. In addition, the unsoldered and loose components can separate from the board. The removal of the jammed board from the machine can be a hazardous operation if the board is jammed in the solder bath. In addition, molten solder from a wave soldering machine can be channeled by a jammed or warped board diverting hot molten solder into the machine or surrounding area. The operation of a conventional automatic soldering machine does not always make the most efficient use of an operator. For many machines, a single operator must feed the boards in at one end, proceed to the other end of the machine, which range in length from 10 feet to over 20 feet, to remove the soldered boards. Accordingly, the operator spends valuable time walking from one end of the machine to the other during operation of the machine.

At the present time, the majority of circuit boards are fabricated so that the electronic components are mounted on one side of the board, the component side, and the components are soldered on the other side of the board, the solder side, with the leads extending from the component side of the board through the apertured solder junctions on the board to the solder side of the board.

Recently, surface mount devices have come into commercial use. Surface mount devices, commonly called SMDs, are electronic components that are mounted on one side of the board with an adhesive and soldered to the solder junctions on the same side of the board. When SMDs are soldered with an automatic soldering machine, the side of the board with the SDMs is immersed into the surface of the solder bath or wave. Problems have arisen from soldering SMDs with automatic soldering machines. It is believed that gas pockets form at the juncture between the SMDs and the board during the soldering operation which prevents the flow of solder thereto. To overcome this problem, wave soldering systems have been modified by adding a second solder wave flowing in an opposite direction to the first wave so as to direct solder into the junction between the SMDs and the board in two directions to sweep out gas pockets such as the system manufactured by the Electrovert USA Corporation. In a drag soldering operation, the surface of the solder bath is maintained free of ripples and waves, except for the ripples or eddies created by the board as it is transported across the surface of the solder bath.

In both the drag soldering machines and the wave soldering machines, once the board is fed into the device, there is no simple way to retrieve the board until completion of the soldering operation. The machines can be stopped, i.e. the chain conveyor can be stopped, but the machines cannot be reversed at will to return the board to the feed station. Reversal of the machine is not practical because the board would have to proceed back through and interact with each stage it has passed. If the board had partially slipped from the carrier it would jam in either direction. The machine is stopped to retrieve the board from the chain conveyor. This can be hazardous when the board is over the soldering station or the drying and preheating station where there are exposed heating elements.

SUMMARY OF THE INVENTION

The present invention is directed to a circuit board soldering process and an automatic soldering device for soldering conventional electronic components and SMDs to circuit boards. Although a board can jam the operation of the present device, the device, which employs a friction drive circuit board carriage, cannot exert a force on the jammed board that will damage the board or the device. Moreover, the present device provides a soldering machine which returns the soldered board to the feed end so that an operator can operate the machine at a single position and is not required to go from one end of the machine to the other to feed and recover boards. Furthermore, the present device permits retrieval of the board at the feed end at any stage of the soldering operation. When the operation of the machine is aborted, the board is transported back to the feed end without passing through any of the previous stages. In addition, the present invention provides a means of constructing soldering machines that are appreciably shorter and require less floor space than comparable automatic soldering machines of similar capacity. This has been accomplished by using the soldering station as both a drying and preheating station.

The present invention is directed to a process for soldering circuit boards comprising the steps of (a) applying a solder flux coating to the solder side of a board;

(b) drying the flux on the board and preheating the solder side of the board by sequentially
  (i) directing a stream of warm gas over the solder side of the board,
  (ii) positioning the solder side of the board over a hot molten solder bath, (c) soldering the solder junctions on the board by immersing the solder side of the board into the surface of the hot molten solder bath by sequentially
  (i) immersing a first edge of the board into the surface of the solder bath,
  (ii) lowering the remainder of the board into the surface of the solder bath,
  (iii) longitudinally moving the board in the solder bath, and
  (iv) lifting the board from the surface of the solder bath at an angle to the surface of the solder bath to drain the excess hot molten solder from the board, The terms "board" means printed circuit boards. The term "flux" is meant to include aqueous, nonaqueous and rosin soldering flux. The flux is usually applied to the board as a foam or spray to insure that the entire solder side of the board is evenly, uniformly and thinly coated and substantially free of holidays, i.e. holes in the coating.

The board, after application of the flux coating, is passed over an air knife, i.e., stream of warm gas, such as warm air, helium, argon, or the like, that is nondeleterious to the board, the solder junctions, electrical contacts, and the electrical components. The warm gas is normally heated to a temperature of about 150° F. Warmer gas can be used to dry the flux coating, such as gas warmed to a temperature up to 500° F. However, the board should not be dried with a gas heated to a temperature which will distort or warp the board or damage the electrical components. The board is subject to the stream of warm gas the length of time it takes the board to traverse the air knife. The first passage of warm gas removes most of the moisture or solvent from the flux coating. Thereafter, the board is poised over a molten solder bath to substantially complete the drying of the flux coating and preheat the solder junctions. Typically, the temperature of the solder bath will be between 450° and 500° F., preferably about 460° F. The board is stationed over the solder bath for about 1 second to about 99 seconds, preferably from about 10 to about 20 seconds. The board is stationed at a height of about ¼ to about 2 inches above the surface of the solder bath, preferably, about ½ inch above the surface of the solder bath.

After the board has been preheated over the solder bath, it is optionally passed once or twice through a stream of warm gas as an additional drying step to remove all moisture or solvent from the flux coating. A dry flux coating is crucial for proper soldering. If a board is immersed in the solder bath with a moist flux coating, gas bubbles are rapidly formed. The gas bubbles may act as a barrier to the solder and prevent uniform and even soldering.

The process provides a way of substantially preventing the formation of air and gas pockets between the surface of the solder and the board. One edge (the first edge) of the board is first immersed in the surface of the solder. Only the solder side of the board actually is immersed into the solder bath. The component side of the board remains above the surface of the solder. A wedge-shaped air space bounded by the surface of the solder and the solder side of the board is thus formed. As the remainder of the board is lowered into the surface of the solder, the size of the wedge-shaped air space is decreased forcing the air out of the wedge which substantially eliminates the possibility of air being trapped between the solder side of the board and the surface of the solder. The immersion of the whole board into the surface of the solder takes between about 0.5 to about 10 seconds, preferably between about 1 and about 2 seconds. The board is allowed to remain in the surface of the solder bath to complete the soldering for about 1 second to about 10 seconds, preferably about 3 to 4 seconds. The board is then moved horizontally in one direction to sweep out any air and gas bubbles that might have been trapped between the circuit board and the surface of the solder to permit the molten solder to reach areas that were masked by the air and gas bubbles. Optionally, the board may be oscillated traversely in the surface of the solder to further the sweeping of air and gas bubbles. The board is then lifted from the surface of the solder at an angle with respect to the surface of the solder bath. This angled position permits excess molten solder to flow down the solder side of the board back into the bath. The board can then be moved to a horizontal position parallel to the surface of the solder. During the solder operation, the solder side alone comes in contact with the surface of the solder bath. The height of the solder bath is adjusted so that the board is immersed into the surface of the bath to a depth equal to approximately one-half (½) of the board's thickness.

Optionally, the board may be passed through a gas stream to cool the board after its removal from the solder bath. Thereafter, the soldered board is treated in a conventional manner. For example, heat and solvent sensitive components may be soldered by hand onto the board or additional components that are to be secured to the solder side of the board may be attached and hand soldered or alternatively, soldered by the above process with the original component side now being treated as the solder side. The board may also be washed to remove the flux coating.

In an alternative embodiment of the present invention, after the board is immersed in the surface of the solder, the board is moved or oscillated backwards and forward one or more times to sweep out any air and gas pockets trapped between the board and the surface of the solder. This is especially beneficial when soldering SMDs attached to the solder side of the board which are immersed in the solder bath. Boards with SMDs have a greater tendency to trap air and gas bubbles than boards free of electronic components on the solder side. The back and forth movement of the board in the surface of the solder permits the molten solder to sweep and move trapped air and gas bubbles to obtain a uniform, even coating of solder at the solder junctions.

The present invention is also directed to a circuit board soldering device for carrying out the above-identified process. The present circuit board soldering apparatus, which also may be used to solder SMDs, comprises:

(a) a base unit having two longitudinally extending sides connected to a first end and an opposing second end, a top portion connected to and bounded by said sides and ends with an open longitudinal central cavity, and two spaced-apart, parallel longitudinally extending rails mounted on the top portion on opposing sides of said central cavity;

(b) a foam means for generating a flux foam standing wave mounted in said central cavity approximately midway between said ends for applying a flux coating to the solder side of a circuit board;

(c) a heated solder pot mounted in said central cavity approximate said second end for holding a hot, molten solder bath for soldering the solder side of the circuit board;

(d) a air knife means for generating a warm air stream mounted in said central cavity between said foam means and said solder pot for drying the flux coating on the circuit board;

(e) a powered, wheeled circuit board transport adapted to ride on said rails to carry the circuit board from the first end across the foam means, the air knife means to the second end over said solder pot and back again;

(f) two powered cam means laterally mounted in said transport rotatable to a high position, a medium position and a low position, said cam means adapted to carry and vertically move a circuit board carrier to a high home position, a medium fluxing position and a low soldering position;

(g) first sensing means to detect the position of said transport along said longitudinal base;

(h) second sensing means to detect the position of each of said cam means; and (i) control means connected to said first and second sensing means to receive signals therefrom and connected to said powered transport and said powered cams to send control signals thereto to move said transport longitudinally along said base unit and to rotate said cam means in a predetermined sequence.

In one embodiment of the present invention, the above soldering apparatus carries out the soldering operation of a circuit board in four stages or steps. At the commencement of the operation, the cams are positioned in a medium fluxing position and one or more circuit boards are mounted in the circuit board carrier supported by the transport. The transport moves from the front or first end towards the solder pot at the production, rear or second end (i) to apply a flux coating at the foam means to the solder side of the board, (ii) to predry the flux coating at the air knife means, and (iii) to preheat the board over the solder pot which contains hot molten solder.

In an optional second step of the operation cycle, the cams rotate to a high home position and the transport moves towards the front end to further dry the flux coating at the air knife means. In the third step of the operation cycle, which is only employed when the second step is employed, the transport moves back to, and is positioned over, the solder pot. One set of cams rotate to a low soldering position to lower a first edge of the board toward the surface of the solder bath, then the second set of cams rotate to a low soldering position to lower the the board, commencing with one edge of the board, into the surface of the solder bath to complete the soldering. After a predetermined period of time, the first set of cams rotate to a high home position to move the board transversly in the surface of the solder bath and to lift the board away from the solder bath. The board is now positioned at an angle with respect to the surface of the solder bath to permit with excess hot, molten solder to drain from the board. Thereafter the second set of cams rotate to a high home position and move the board to a horizontal position parallel to the surface of the solder bath. In the fourth step of the operation cycle, the transport moves back to the front end of the device. After the transport returns to the front end, both sets of cams rotate to a medium fluxing position. In an alternative embodiment of the present invention, the cams are partially rotated clockwise and counterclockwise to move the board longitudinally back and fourth in the surface of the solder bath after the board has been fully immersed in the surface of the solder bath to sweep out any trapped gas bubbles.

The above functions of the transport and the cams can easily be controlled by hard switches, conventional computers and microprocessors, and other conventional devices known to the art. The position of the cams is sensed by the second sensing means and the position of the transport on the base unit are detected by the first sensing means which is signaled to the control circuit.

When the cams are in a high home position, boards mounted on the circuit board carrier will clear the solder pot, the air knife means and the foam means. When the cam are in a medium fluxing position, the board when transported along the length of the device will be coated with a flux coating at the foam means and can be subject to the air knife means; however, the board will clear the surface of the solder bath. When the cams are in a low soldering position, the board when it is moved along the length of the device, will not clear the foam means, air knife means or solder pot. Accordingly, in the preferred embodiment of the present invention, the device includes an abort circuit and an abort button which will transmit an abort signal to the control circuit, which will over ride all other signals received by and transmitted to the control circuit. The control circuit, upon receipt of the abort signal, will command the cams to rotate to the high home position, thus lifting the board above the solder pot, air knife means, and foam means, and move and return the transport to the front end of the device.

BRIEF DESCRIPTIONS OF THE DRAWINGS

FIG. 7 is a side elevational view of the valve control mechanism for the butterfly valve of the flux foam generator of FIG. 3;

DETAILED DESCRIPTION OF THE INVENTION

Figure 1:
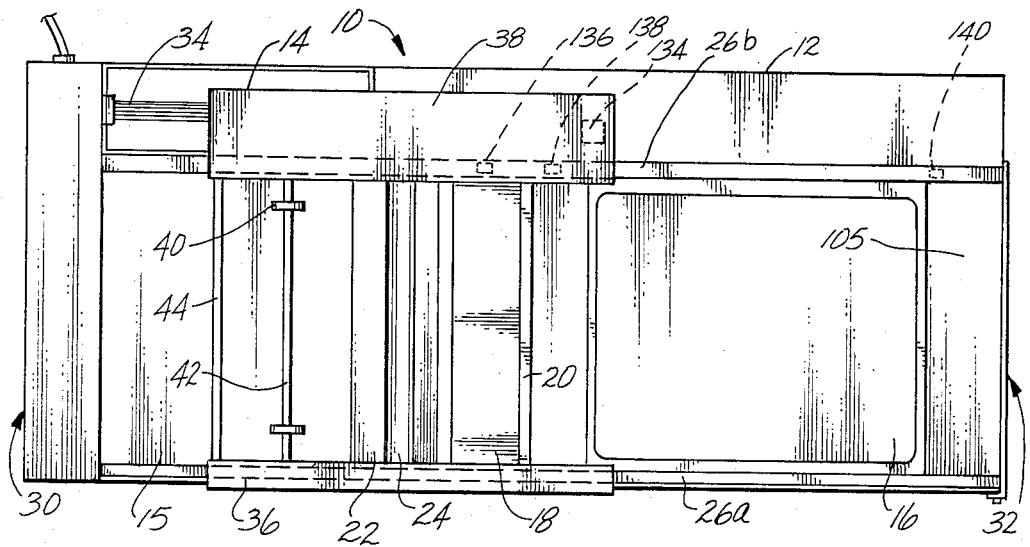
FIG. 1 is a top plane view of the circuit board soldering apparatus of the present invention.
Figure 2:
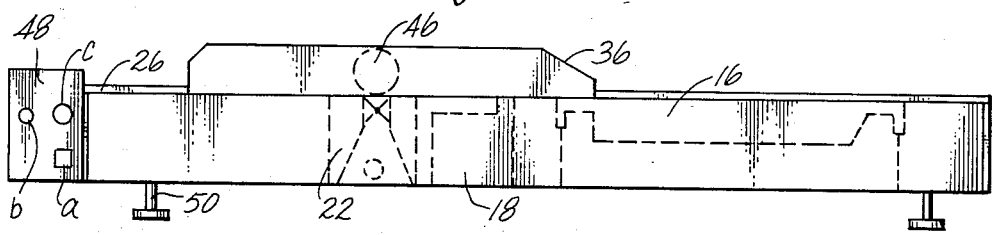
FIG. 2 is a side elevational view of the right side of the circuit board soldering apparatus.

Referring to FIG. 1, the circuit board soldering apparatus 10 of the present invention is shown in the top plane view. The apparatus comprises a base or console 12 and a powered circuit board transport 14 that is adapted to move longitudinally along the length of the console by a friction drive. The console has a central cavity 15, running substantially the full length of the console. A solder pot 16 traversing the width of the control cavity is located at the production end (or rear end or second end) of the cavity for holding a hot molten solder bath. A warm air generator or air knife 18 is positioned within the central cavity adjacent to the solder pot. The warm air generator has a duct 20 traversing the width of the central cavity to direct a warm air stream upward and create an air knife. A foam generator 22 with a foam duct 24 is positioned within the central cavity adjacent to the warm air generator. The foam duct 24 traverses the width of the central cavity to direct a foam barrier or standing wave of foam (not shown) across the width of the cavity for coating boards as described herein. Two parallel rails 26 are mounted on top of the console on opposite sides of the central cavity and run the full length of the console. The rails have a smooth upper surface with a brushed, satin or polished finish. The solder pot is located at the production or rear end 32 of the console. Boards are fed into and retrieved from the feed or front end 30 of the console.

The solder pot 16 is of conventional design and is equipped with a heating element (not shown) to heat the pot and the solder bath contained therein and a thermocouple (not shown) to monitor the temperature of the solder bath. The warm air generator is of conventional design and has an electric motor powered blower (not shown) and heating elements (not shown) to generate a warm air stream. Preferably, to save power, the warm air generator is controlled by a control circuit, described herein, which turns the blower and heating elements on during the flux drying steps of the soldering operation of the apparatus. Preferably the temperature of the solder bath is monitored and controlled by the control circuit also.

A ribbon cable 34 runs from the feed end of the console into the transport. The ribbon cable feeds power and control signals to the transport from a control circuit described herein which can be mounted in, on or outside of the console. Location or position signals from the transport are also transmitted via the ribbon cable to the control circuit. The ribbon cable is secured to the console and the transport such that the cable forms a U shape when viewed from the side. As the transport moves longitudinally from the feed end to the production end, the U-formed ribbon cable unwinds lengthening the leg attached to the console and shortening the leg attached to the transport. When the transport moves longitudinally from the production end to the feed end, the U-formed cable ribbon winds back to its original U-shaped configuration with the leg attached to the console shortening and the leg attached to the transport lengthening within a cover 38 of the transport. The console is mounted on four adjustable support legs 50. The legs are adjustable to properly level the console and the surface of the molten solder bath in the solder pot.

Figure 4:
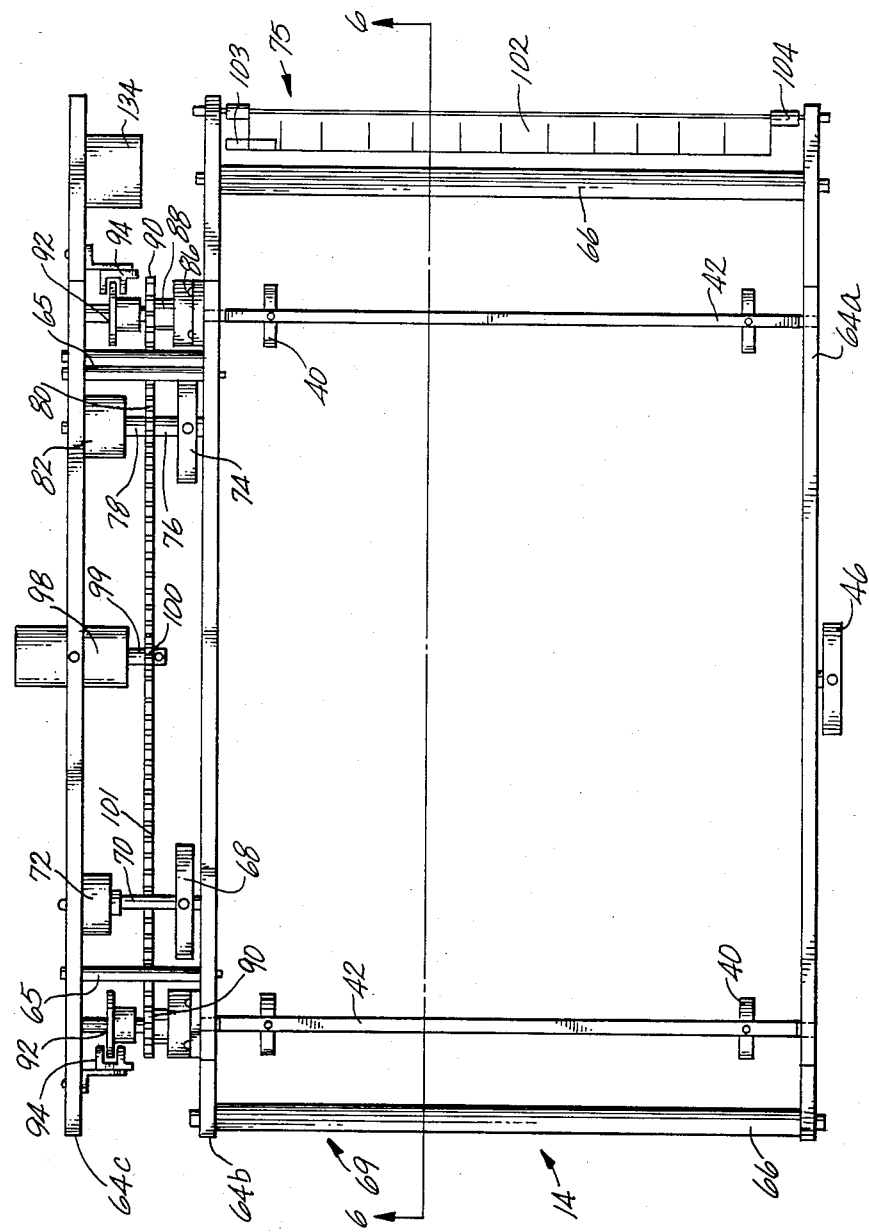
FIG. 4 is a top fragmentary sectional view of a circuit board transport of the circuit board soldering apparatus.

The transport 14 has a right hand cover 36 and left hand cover 38 which are removable. The transport has two laterally extending cam shafts 42 (FIG. 4). Each cam shaft has two spaced-apart carrier cams 40, the operation of which is further described with reference to FIGS. 6 through 6E herein. The transport has cross braces 44 which are attached to longitudinal frames 64 which are shown in FIG. 4. The right side of the transport is supported by a single wheel 46 that is adapted to roll along the right hand rail 26a. At the feed end of the console there is located a control panel 48 having an on-off power switch a, a solder operation cycle start button b and an emergency reset or abort button c.

Figure 3:
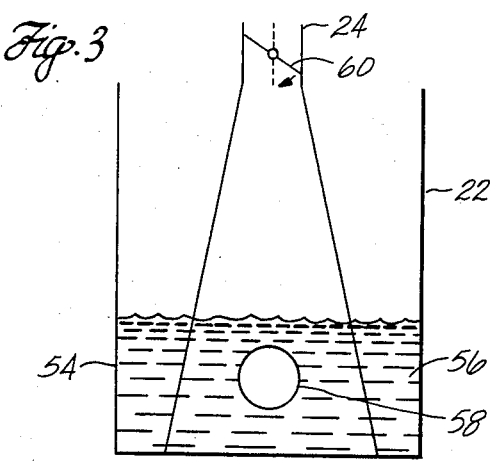
FIG. 3 is a vertical sectional view of the flux foam generator of the circuit board soldering apparatus of the present invention.

Now referring to FIG. 3, the foam generator 22 comprises a reservoir 54 for liquid aqueous or nonaqueous flux 56 and a foam duct 24 located approximately in the center of the reservoir. The reservoir and duct extend across the width of the central cavity. A cylindrical foam aerator 58 is mounted in the middle of the duct slightly below the level of the liquid flux. A gas line connected to a gas source (not shown) is attached to the foam aerator to create a mist of fine bubbles within the flux which form a flux foam. The foam extends upwardly in the duct to create a standing foam wave or foam barrier along the full length of the duct. Excess foam flows over the edges of the mouth of the duct and slides down the outer wall of the duct to the reservoir. A butterfly valve 60 (shown in the closed position) is mounted in the mouth of the duct to open and close the duct during operation of the apparatus. The valve is opened when the foam coating is applied to the board. During the remainder of the operation, the valve is closed to prevent splattering of the flux and inhibit solvent evaporation from the flux foam. When the valve is closed, the flux foam standing wave quickly breaks down and disappears. When the valve is open, the flux foam standing wave forms almost immediately for the flux coating operation. The butterfly valve 60 can be controlled by a mechanical linkage, electro-mechanical linkage or by electrical means.

A mechanical linkage is illustrated in FIG. 7. Shaft 124 is connected to the vanes or flaps of valve 60 and extends out beyond the end walls (not shown) of foam duct 24. L-shaped strike lever 126 is mounted on shaft 124 and is adapted to rotate about the shaft. L-shaped valve lever 128 is fixed to the shaft and the valve rotates with the rotation of lever 128. The levers 126 and 128 have opposing horizontal legs which function as counterweights to maintain the two levers in the position illustrated in FIG. 7. When the levers are in the position shown, the valve 60 is closed. The tab 130 on the side of lever 126 engages the vertical arm of lever 128 and rotates lever 128 when lever 126 is rotated in a clockwise direction which opens valve 60 by positioning the valve vanes in a vertical position (shown by dotted lines in FIG. 3). The mechanism illustrated in FIG. 7 is located in the central cavity adjacent the left hand rail 26b. When the transport advances from the feed end to the production end, the longitudinal frame 64b of the transport strikes the vertical arm of lever 126 rotating levers 126 and 128 approximately 45° in a clockwise direction, which in turn opens the butterfly valve to a full open position. When the transport moves beyond the foam generator 22, lever 126 is no longer constrained by frame 64b and levers 126 and 128 rotate counterclockwise to the position shown in FIG. 7 closing the valve as shown in FIG. 3. When the transport moves from the production end to the feed end, the longitudinal frame 64b of the transport strikes the vertical arm of lever 126 and rotates it about 45° in a counterclockwise direction. Lever 128 does not make contact with the longitudinal frame and tab 130 and is not rotated; accordingly, the valve remains closed when the transport moves towards or returns to the feed end. When the transport moves beyond the foam generator, lever 126 is no longer constrained by the longitudinal frame and swings clockwise to the position shown in FIG. 7.

The details of transport 14 are further shown in FIG. 4. The transport has three spaced-apart parallel longitudinal frames 64. The frames are traversely connected by lateral struts 66 and 65. A single wheel 46 is mounted centrally on the right hand longitudinal frame 64a and is adapted to rotate freely. A second wheel 68 is mounted on the left hand side. Wheel 68 is attached to shaft 70 which is support for rotation by the near left hand side frame 64b and electro-brake 72 mounted on the far left hand side frame 64c. A third wheel 74 is also mounted on the left hand side of the transport. Wheel 74 is attached to shaft 76 which is supported for rotation by frame 64b and electro clutch-brake 82 mounted on frame 64c. A sleeve 78 extends from the clutch-brake 82 concentrically with shaft 76 and has a sprocket 80 mounted thereon. Wheels 68 and 74 ride on the left hand rail 26b. Both cam shafts 42 are supported for rotation at one end by frame 64a and at the other end by frames 64b and 64c. On the left hand side, the shafts are mounted concentrically to electro clutch-brakes 86 and sleeves 88 extending outwardly from clutch-brakes 86. Sprockets 90 are mounted on each sleeve 88. The construction of both cam shafts, their supporting structure and their drive structure are substantially similar. Each cam shaft has a positioning disk 92 mounted concentrically thereon. The disks rotate through a photoelectric units 94 having a photo element and detection element (not shown). The photoelectric units are mounted on frame 64c. The disks have opaque and clear areas. The clear areas and photoelectric units are positioned relative to cams 40 so that the photoelectric units can detect when the cams 40 are facing vertically downward, horizontally sideways and vertically upward.

Motor 98 is mounted on frame 64c for powering the cam shafts 42 and the drive wheel 74. A sprocket 100 is mounted on a drive shaft 99 of the motor. The sprockets 80, 90 and 100 are positioned in line, in a single plane, so that they all are connected and driven by a single chain belt 101 which is powered by motor 98.

At the production end 75 of the transport a skimmer blade 102 is transversely mounted between longitudinal frames 64a and 64b and is adapted for rotation about fingers 104 which are rotatably carried by the two longitudinal frames. On the left hand side of the blade a guide pin 103 extends outwardly to the side which is adapted to slide along the left hand side of the solder pot 16 when the transport is moving across the pot.

The skimmer blade normally hangs vertically downward except when it is positioned over the solder pot 16. When the transport is passing over the pot from the feed end to the production end, the blade is supported in a horizontal position by the hot molten solder on the pot and by guide pin 103. When the transport moves across the solder pot 16 from the feed end to the production end, the skimmer blade skims off the metal oxide skin on the surface of the hot molten solder and deposits it in oxide reclaim chamber 105 at the production end of the console (FIG. 1). When the transport is positioned over the pot for the preheating and soldering steps, the skimmer blade is positioned over the reclaim chamber. When the transport moves across the solder pot 16 from the production end to the feed end, the skimmer blade is reversed and guide pin 103 slides along the left hand side of the solder pot lifting the skimmer blade above the surface of the hot molten solder in the pot. The metal oxide skin interferes with soldering. Accordingly, removal of the metal oxide skin just prior to the soldering step is preferred.

Figure 5:
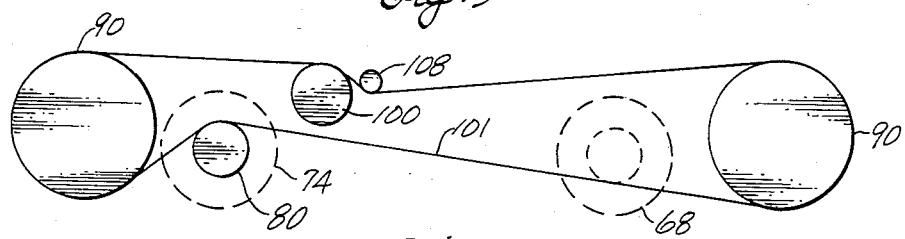
FIG. 5 is a schematic view of the drive train of the transport of FIG. 4.

The drive path of the chain belt 101 is graphically illustrated in FIG. 5. Motor 98 drives the chain belt via sprocket 100. The chain belt in turn drives sprocket 80 of the drive wheel 74 and sprockets 90 of the two cam shafts 42. Drive wheel 74 is powered when electro clutch 82 is actuated; the power being transmitted from the motor through the chain belt, sprocket 80, sleeve 78, clutch 82 and shaft 76. Wheel 68 is unpowered but has an electro brake 72 wired in parallel with electro clutch 84; they are actuated together. When brake 72 is electrically actuated, wheel 68 via shaft 70 is braked to a stop to brake the movement of the transport. When brake 72 is electrically actuated, the brake is released and wheel 68 is free to turn. The cam shafts 42 are operated independently and rotated when electro clutch brakes 86 are electrically actuated. Units 86 function as brakes when they are not electrically actuated. When units 86 are actuated, shafts 42 are rotated by motor 98 via the chain belt 101, sprockets 90, sleeves 88 and electro clutch-brakes 86. Tension is maintained on chain belt 101 by idler pulley 108 which is schematically shown in FIG. 5.

Figure 6:
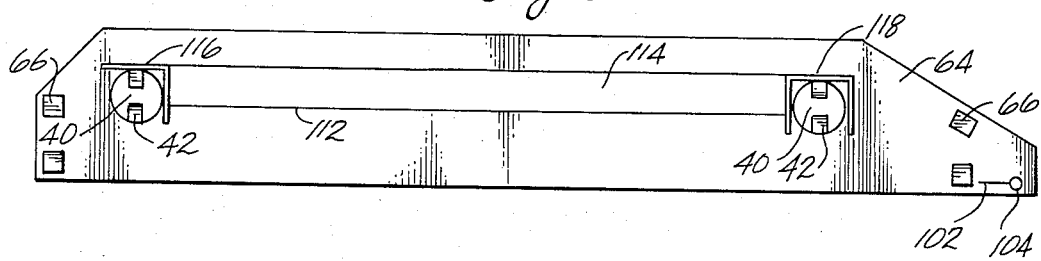
FIG. 6 is a vertical sectional view on lines 6—6 of FIG. 4 of the transport.
Figure 6A:
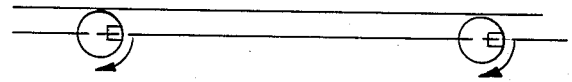
FIG. 6A is a schematic view of the cams and circuit board carrier of FIG. 6 in a medium fluxing position.
Figure 6B:
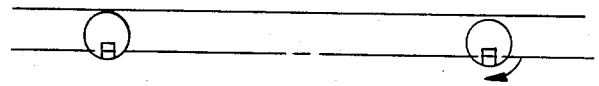
FIG. 6B is a schematic view of the cams and circuit board carrier of FIG. 6 in a high home position.
Figure 6C:
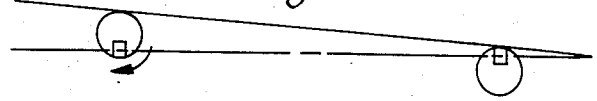
FIG. 6C is a schematic view of the cams and circuit board carrier of FIG. 6 in the first stage of the soldering step.
Figure 6D:
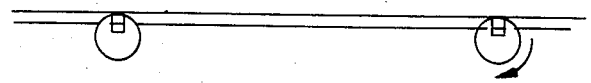
FIG. 6D is a schematic view of the cams and circuit board carrier of FIG. 6 in the low soldering step.
Figure 6E:
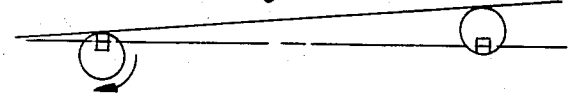
FIG. 6E is a schematic view of the cams and circuit board carrier of FIG. 6 in the final stage of the soldering step.
Figure 8:
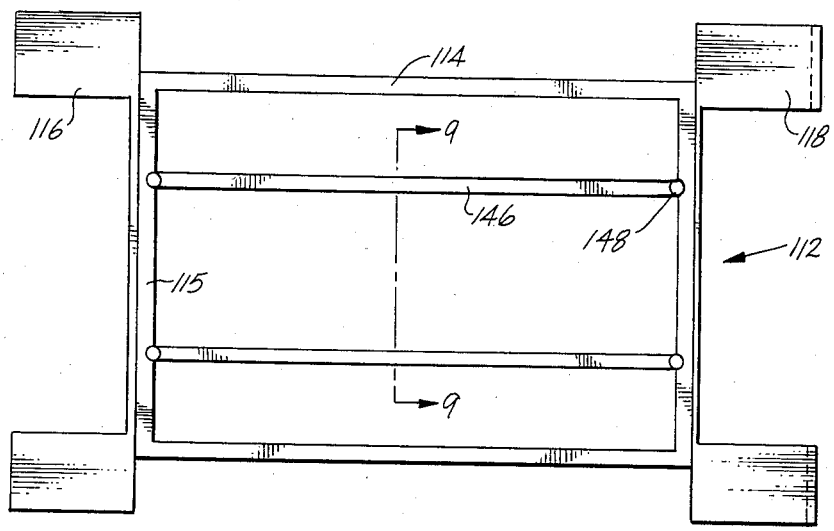
FIG. 8 is a top view of a circuit board carrier illustrated in FIG. 6 carried by the transport.

The operation and function of the cams 40 is illustrated in FIGS. 6 through 6E. The cam shafts 42 and cams 40 support a removable rectangular circuit board carrier 112 (see also FIGS. 8 and 9) having longitudinal side members 114 connected at each end to lateral end members 115 (FIG. 8). The carrier is adapted to receive fingers 150 (FIG. 9) for carrying and supporting boards for the soldering operation. Boards are supported on their periphery by a plurality of fingers which are biased toward the board and removably secure the board.

L-shaped brackets 116 are mounted at the corners of the feed end of the carrier 112. The brackets 116 are adapted to ride on cams 40. U-shaped or channel brackets 118 are mounted at the corners of the production end of the carrier 112 and are adapted to be carried by the cams 40. The cams and the cam shaft rotate in a clockwise direction. The cams are adapted to support the carrier 112 in one of five positions. The cam movement is coordinated with the operation of the transport during the soldering operation by the control circuit. In operation, boards are removably mounted in the carrier 112. When the soldering operation is commenced by punching start button b in control panel 48, the cams are in the medium fluxing position (FIG. 6A) and the transport moves from the feed end to the production end to coat the underside, i.e., the solder side, of the board with flux, predry the coated board and preheat the board over the solder pot 16. In the second step of operation, the cams rotate to a high home position (FIG. 6B) and the transport moves from its position over the pot towards the feed end to a position in front of the warm air generator. In the next step of operation, the transport moves toward the production end to a position over the solder pot, the cams independently rotate to the low soldering position (FIGS. 6C and 6D) to lower the boards into the solder pot. Thereafter, the cams independently rotate to the high position (FIGS. 6E and 6) to lift the boards from the solder pot. In the final step, the transport moves to the feed end. Upon the transports return to the feed end, the cams rotate to the medium fluxing position (FIG. 6A) to complete the solder operation cycle.

During the operation, three sensors mounted in the console underneath the left hand rail detect the position of the transport when it is at the feed end, sensor 136, when it is positioned over the solder pot, sensor 140 and when it is positioned in front of the warm air generator, sensor 138. The sensors 136, 138 and 140 are reed switches that are actuated by a permanent magnet 134 carried by longitudinal frame 64c of the trnasport (FIG. 4) Information regarding the position of the transport is received by the control circuit described below which actuates the cam as described herein. At the beginning of the first step of the cycle, the cams are in the position shown in FIG. 6A with the carrier and the boards mounted in a medium fluxing position. In this position, the boards kiss the flux foam wave generated by the flux foam generator 22 but clear the hot molten solder bath in the solder pot 16. When the start button b is pressed, the control circuit actuates motor 98, clutch 82 to power drivewheel 74 and releases brake 72. When the cams are in the medium fluxing position, the boards mounted in carrier 112 brush across the flux foam wave or barrier formed on top of the foam duct 24 to coat the solder side of the board. The transport continues to move towards the production end after passing foam generator 22, by passing over the warm air generator 18 to a position over solder pot 16 which contains a hot molten solder at a temperature of about 460° F. The control circuit can be programmed to position the transport over the solder pot for a set period of time for the preheating treatment. When the transport is positioned over the solder pot. sensor 140 detects and transmits the transport's location to the control circuit. The control circuit then electrically deactuates clutch 82 and brake 72 to stop wheel 68 to brake the transport to a stop. Brake 72 is locked or braked in its deactuated state. When brake 72 is actuated, i.e. electrically energized, the brake is released. When the transport passes over the pot, the skimmer blade 102 skims the metal oxide skin off the surface of the solder bath and deposits the metal oxide in chamber 105. The control circuit then actuates clutch-brakes 86 to move the cams 40 to a high home position. The photoelectric units 94 and the positioning disks 92 detect the position of the cams and this information is received by the control circuit which disengages the electro clutch-brakes 86 when the cams are in the high home position. As described above, the clutch-brakes function as brakes except when electrically actuated and prevent the cam shafts from rotating. Thereafter, motor 98 is stopped and reversed and brake 72 and clutch 82 actuated to move the transport back towards the feed end. The transport passes over the air knife station; when it reaches a position in front of the air knife, its position is detected by sensor 136, which transmits a signal to the circuit control. The circuit control deactuates clutch 82 and brake 72 to brake the transport to a stop in front of the air knife station, that is, a position between the feed end and the warm gas generator 18. The circuit control then stops motor 98 and brake 72 and clutch 82 are actuated to drive wheel 74 to move the transport towards the production end of the device. When the transport reaches a position over the solder pot 16, its position is detected by sensor 140 which transmits a location or position signal to the control circuit. The control circuit deactuates clutch 82 and brake 72 to brake the transport to a stop over the solder pot. When the transport passes over the solder pot, the skimmer blade 102 again skims the metal oxide skin off the solder bath to yield a clean surface for soldering. Immediately thereafter, clutch-brakes 86 of the cam shaft 42 closest to the production end is actuated by the control circuit to the position the cams on the shaft in a low soldering position may cause a first edge of the board to be immersed in the surface of the hot molten solder bath in the solder pot depending upon the position of the board within the carrier. The position of the cam is detected by the photoelectric unit 94 which transmits a position signal to the control circuit. When the cams have reached the low soldering position, the control circuit deactuates clutch-brake 86 to brake cam shaft 42. Immediately thereafter, clutch-brake 86 of the cam shaft 42 closest to the feed end of the device is actuated by the control circuit to move the cams 40 on the cam shaft into the low soldering position to immerse the board, commencing with a first edge, into the surface of the hot molten solder for the soldering operation. The position of the cams are detected by the photoelectric unit 94 which transmits a position signal to the control circuit. When the cams 40 are in the low soldering position, the control circuit deactuates the clutch-brake 86 of the cam shaft 42 to brake the the cam shaft to a stop. After a predetermined amount of time, which is a user definable process variable that the operator can program into the control circuit, the control circuit actuates clutch-brake 86 of the cam shaft 42 closest to the production end of the device to rotate the cams 40 into a high home position to lift the board, commencing with the first edge, from the surface of the hot molten solder bath. The motor 98 is pulsed by the control circuit at this point to rotate the cam shaft 42 at a predetermined speed, which is a user definble process variable that is programmed into the control circuit. The position of the cams 40 are detected by the photoelectric unit 94 which transmits a position signal to the control circuit. When the cams are in the high home position, the control circuit deactuates clutch-brake 86 braking the cams to a stop. The board is lifted from the solder bath at a predetermined speed to minimize solder bridging and icicling on the solder side of the board from the excess hot, molten solder. After a predetermined time interval, which is a user definable process variable that can be programmed into the control circuit, the clutch-brake 86 of the cam shaft 42 closest to the feed end of the device is actuated by the control circuit to rotate the cams 40 to a high home position to remove the board to a horizontal position parallel to the surface of the solder bath. The position of the cams 40 are detected by the photoelectric unit 94 which transmits a position signal to the control circuit. When the cams are in the high home position, the control circuit deactuates clutch-brake 86 braking cam shaft 42 to a stop. The control circuit then sequentially stops the motor 98, reverses motor 98, and actuates brake 72 and clutch-brake 82 to drive drive wheel 74 to move the transport from its position over the solder pot to the feed end of the device. The position of the transport at the feed end of the device is detected by sensor 136 which transmits a location signal to the control circuit. When the transport reaches the feed end, the control circuit sequentially deactuates clutch-brake 82 and brake 72 to brake the transport to a stop, stops motor 98, reverses motor 98, and actuates clutch-brakes 86 to rotate the cams 40 of both cam shafts to a medium fluxing position. The photoelectric units 94 detect the positions of cams and transmits a position signal to the control circuit. When the cams are in a medium fluxing position, the control circuit deactuates clutch-brakes 86 to brake the cam shafts. The operator of the device can then remove the soldered circuit boards from the carrier and replace them with other boards that are to be soldered. When the carrier is loaded with boards, the operation is started again by pushing the start button b of control panel 48.

The entire operation of the machine can be controlled at the feed end of the device where the boards are fed and unloaded and the control panel is located.

Figure 9:
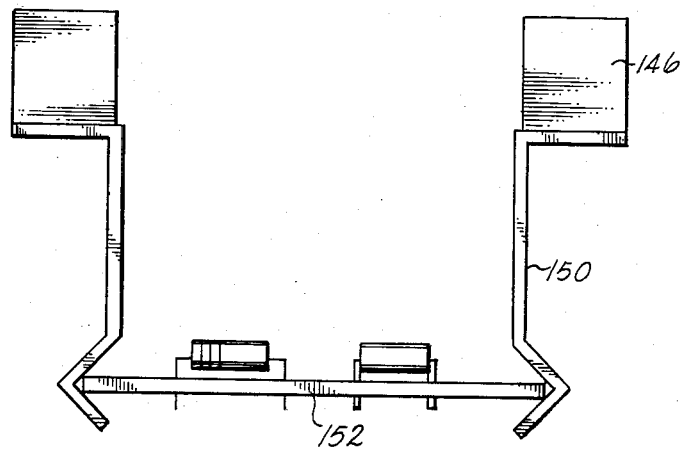
FIG. 9 is a fragmentary vertical sectional view of the carrier of FIG. 8 along lines 9—9.

The carrier 112 is illustrated in a top plane view in FIG. 8. The carrier has a rectangular frame with longitudinal side members 114 and lateral end members 115. L-shaped brackets 116 are mounted at the corners of one end of the frame and U-shaped or channel brackets 118 are mounted at the corners of the other end of the frame. Adjustable cross members 146 are mounted longitudinally in the frame. The lateral end members are L-shaped members with their foot portion on the lower side of the frame facing inwardly to the middle of the frame. The adjustable cross members are supported by the foot, a clamp block (not shown) and secured by thumb screws 148. As shown in FIG. 9, spring fingers 150 extend downwardly from the bottom of the adjustable cross members 146. The fingers have a hook shape configuration at their lower ends to receive the periphery of circuit boards 152. Preferably, the fingers are made from a spring-type metal that is not wettable by the solder. Circuit boards are easily inserted into and removed from the fingers. The fingers are biased inwardly towards a central longitudinal axis of the carrier to support each circuit board at its periphery. Each adjustable cross member 146 has a plurality of fingers spaced about 1 inch to about ¾ inch apart to give multiple points of support for each circuit board. Although the carrier 112 is illustrated with two adjustable cross members, the carrier can have more cross members with fingers to support one or more boards. Preferably, when more than one board is to be soldered during an operational cycle, the boards are mounted longitudinally in the carrier abutting each other so that in effect, a single long board is being soldered. Two or three rows of abutting boards can be soldered in the carrier in this fashion at once.

Figure 10:
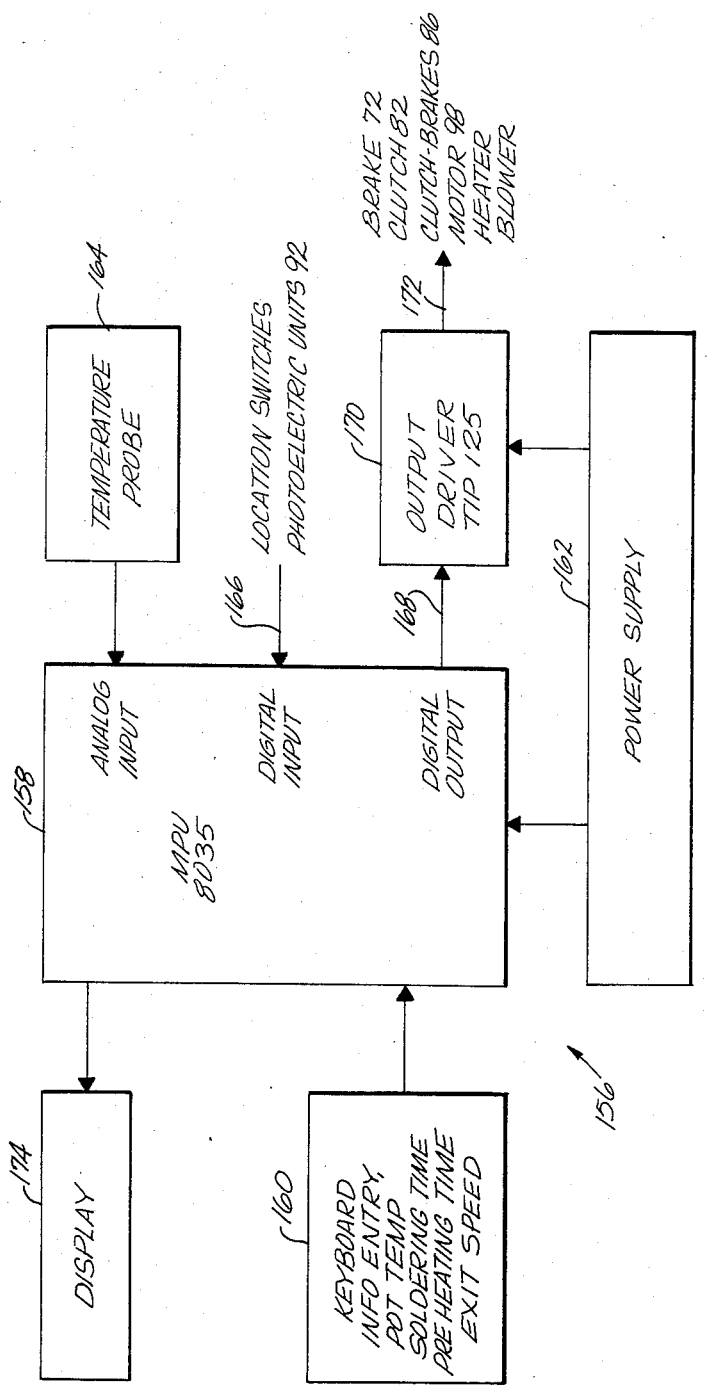
FIG. 10 is a block diagram of the control circuit for the circuit board soldering apparatus.

The control circuit is shown in FIG. 10. The heart of the control circuit is a microprocessing chip 158. A MPU 8035 microprocessing chip may be employed in the operation of the present invention. The 8035 chip is manufactured by a number of firms, including Texas Instruments and National Semiconductor Corporation. The chip is programmed with a master resident program with a conventional microprocessor chip programmer. The computer program listing of the master resident program programmed into the 8035 chip (supplier: Texas Instruments) employed in the present invention is set forth herein.

A keyboard 160 is electrically connected to the chip 158 to input subsidiary overlay programs and user definable process variables into the chip, such as (i) the desired solder pot temperature, (ii) the soldering time, i.e., the amount of time that the board remains in the surface of the solder, (iii) the preheating time, i.e., the amount of time that the board is stationed over the solder pot during the preheating stage, and (iv) the solder exit speed, i.e., the speed at which the board is lifted from the surface of the solder, at an angle with respect to the solder pot, to permit drainage of the excess solder off the soldered boards. A conventional power supply is electrically connected to the microprocessing chip 158 and the output driver 170. The power supply supplies 5 volts to the chip 158 and 24 volts to the driver 170. A thermocouple 164 is attached to the solder pot and electrically connected as an analog input into the chip 158. Location switches or sensors 136, 138 and 140 and photoelectric units 92 are electrically connected to the digital input 166 of the chip 158. Control signals from the chip are transmitted to the driver 170 from digital output 168. In actuality, there is a separate output driver for brake 72 and clutch 82, each clutch-brake 86, motor 98, the pot heater and the blower and heating elements for warm gas generator 18. The power from the power supply 162 is supplied to each driver 170. In the present apparatus, power transistors TIP 125 were employed as output drivers. The heater elements for the solder pot are powered by 220 volts and the output driver is connected to a power relay to supply the necessary current to the heater. The blower and heating elements of the warm gas generator 18 are powered by 120 volts. and the output driver is connected to a power relay to supply the necessary current to the blower and heating elements. An additional digital output from the chip 158 is connected to a digital display 174. By the appropriate keyboard entry, the programmed pot temperature, soldering time, preheating speed and solder exit speed can be displayed on the display 174.

The description of the operation of the apparatus of the present invention has been described above with respect to the location switches or sensors 136, 138 and 140, the photoelectric units 92, brake 72 and clutch 82, the clutch-brakes 86 and the motor 98. Preferably, the microprocessor will also control the temperature of the solder pot and control the warm gas generator. The operator selects a solder bath temperature and enters it into the keyboard as a subsidiary overlay program to the master residence program of the microprocessor 158. The microprocessor monitors the temperature of the solder pot via temperature probe 164. When the temperature of the solder pot is less than the programmed temperature, such as 1° F. below the programmed temperature, the microprocessor actuates the output of driver 170 for the solder pot heating elements which transmits a signal 172 to a power relay to power the heating elements. When the temperature of the solder pot exceeds the programmed temperature, the microprocessor deactuates the output of driver 170 for the solder pot heating elements which deactuates to the power relay thus cutting off electrical current to the heating elements. The microprocessor can be programmed to monitor the temperature of the solder pot at desired time intervals, such as 1 second, 10 seconds or 1 minute. The microprocessor can also be programmed to actuate or deactuate the heating elements when the temperature of the solder pot deviates from the programmed temperature by a predetermined value, such as 0.3° F., 1° F. or 3° F.

The warm gas generator 18 has a blower motor and heating elements to produce a warm air or gas stream. To save energy, the warm gas generator is only actuated during the predrying and drying step of the soldering operation when the transport is passing over the warm gas in the generator. Optionally, the microprocessor may be programmed to actuate the warm gas generator after the board is soldered to partially cool the board on its return to the feed end for removal of the soldered board. When the start button b of control panel 148 is actuated, the microprocessor 158 actuates the output driver 170 for the blower and heating elements of the warm gas generator 18 via signal 168 which transmits a signal 172 to a power relay to supply electrical current to the generator 18. When the transport is positioned over the solder pot and the transport position is detected by sensor 140, the microprocessor deactivates the output driver 170 for the warm air generator thus turning off the heating elements and the blower motor. When the transport is reversed and moves towards the feed end during the drying step, the microprocessor actuates the output driver 170 of the warm air generator via signal 168 which actuates the power relay of the generator via signal 172 to supply electrical power to the generator blower and heating elements to form the air knife for the drying step. When the position of the transport is in front of the warm air generator and its position is sensed by sensor 138, the microprocessor 158 deactivates the output driver 170 for the generator thus cutting off power to the warm air generator.

Various user definable process variables can be programmed to entered into the microprocessor via the keyboard 160 to carry out the various operations. For example, the soldering time, i.e., the time the board remains in a horizontal position in the surface of the solder, can be entered. Similarly, the preheating time, i.e., the time the transport is stationed over the solder pot during the preheating step, can be entered. Likewise, the solder exit speed can be entered.

Although the process and device of the present invention have been described with respect to a single embodiment is not intended to limit the invention to this embodiment. The process of the present invention can incorporate optional steps that are within the scope of the invention and other embodiments of the device are within the scope of the invention.

What is claimed is:

1. A circuit board soldering apparatus comprising the following elements:
   (a) a longitudinal base unit having two longitudinally extending sides connected to a first end and an opposing second end, a top portion connected to and bounded by said sides and ends with an open longitudinal central cavity, and two spaced apart parallel longitudinally exending rails mounted on the top portion on opposing sides of said central cavity;
   (b) a foam means for generating a flux foam standing wave mounted in said central cavity approximately midway between said ends for applying a flux coating to the solder side of a circuit board;
   (c) a heated solder pot mounted in said central cavity approximate said second end to hold a pot, molten solder bath for soldering the solder side of the circuit board;
   (d) an air knife means for generating a warm air stream mounted in said central cavity between said foam means and said solder pot for drying a flux coating on the circuit board;
   (e) a powered, wheeled circuit board transport adapted to ride on said rails to carry a circuit board from the first end across the foam means and the air knife means to the second end over said solder pot and back again;
   (f) two powered cam means laterally mounted in said transport, said cam means rotatable to a high home position, a medium fluxing position and a low soldering position, said cam means adapted to carry and vertically move a circuit board carrier to a high home position, a medium fluxing position and a low soldering position;
   (g) first sensing means to detect the position of said transport;
   (h) second sensing means to detect the position of each of said cam means; and
   (i) control means connected to said first and second sensing means to receive signals therefrom and connected to said powered transport and said powered cams to send control signals thereto.

2. The circuit board soldering apparatus of claim 1 wherein said control means is a programmable microprocessor chip programmed with a master residence program adapted to receive a subsidiary overlay program to monitor and control the temperature of said solder pot and user definable process variables to station said transport over the solder pot for a predetermined time to solder the circuit board, to lift the soldered circuit board from the solder bath at an angle thereto at a predetermined speed to drain excess hot molten solder from the solder board, and to preheat the circuit board.

3. The apparatus of claim 1 wherein the control means upon being actuated:
   in a first step, commands said transport to move from said first end to said second end to a position over said solder pot with said cams in a medium fluxing position to apply a flux coating to a circuit board at the foam means, to predry the flux coating at the air knife means and to preheat the board over said solder pot, and then commands said cam means to move said carrier to a high home position;
   in a second step, commands said transport to move from the second end towards said first end to a position between said first end and said air knife means to dry the flux coating at said air knife means;
   in a third step, commands said transport to move from the position between the first end and said air knife means to said second end to a position over said solder pot, then commands said cam means to move said carrier to a low soldering position to solder the board in the hot molten solder bath for a predetermined length of time; and then commands said cam means to move said carrier to a high home position to drain off the excess hot, molten solder from the board and lift the board from said solder path; and
   in a fourth step, commands said transport to move to said first end, and commands said cam means to move said carrier to a medium fluxing position when the transport arrives back at said first end.

4. The apparatus of claim 3 wherein the control means in the third step commands one of the cams means, after the transport has moved to a position over said solder pot, to move to a low soldering position and then commands the other cam means to a low soldering position to immerse the board into the surface of the hot, molten solder bath commencing with one edge of the board.

5. The circuit board soldering apparatus of claim 1 wherein said first sensing means detects the position of said transport when it is positioned at the first end, at a location between said first end and said air knife means, and at the second sensing end positioned over said solder pot; and said second means detects the position of each of said cam means when said cams are in a high home position, a medium fluxing position and a low soldering position.

6. The circuit board soldering apparatus of claim 1 wherein said foam means has a valve means for opening said foam means for the generation of a flux foam standing wave and to close said foam means to stop the generation of a flux foam standing wave, said valve means normally being in a closed position, and said valve means being opened when said transport is moving from said first end to said second end and said cam means are in a medium fluxing position.

7. The circuit board soldering apparatus of claim 6 including valve control means for the valve means which opens the valve means when said transport moves from said first end to said second end and passes over said foam means and said cam means are in a medium fluxing position.

8. The circuit board soldering apparatus of claim 1 wherein said air knife means includes a blower means and a heating element means for generating a warm air stream.

9. The circuit board soldering apparatus of claim 8 wherein said control means is connected to the blower means and heating element means for energizing said blower means and said heating element means when said transport moves from said first end to said second end and passes said air knife means and said cam means are in a medium fluxing position.

10. The circuit board soldering apparatus of claim 9 wherein said control means electrically energizes said blower means and said heating element means when said transport means move from said second end towards said first end to a position between said first end and said air knife means and said cam means have rotated to the high home position from the medium fluxing position.

11. The circuit board soldering apparatus of claim 10 wherein said control means electrically energizes said blower means and said heating element means when said transport moves from a position between said first end and said air knife means to said second end and said cam means are in a high home position.

12. A process for soldering circuit boards comprising the steps of:
(a) applying a solder flux coating to the solder side of a board;
(b) drying the flux on the board and preheating the solder side of the board by sequentially:
 (i) directing a stream of warm gas over the solder side of the board,
 (ii) heating, over a hot molten solder bath, the solder side of the board, with the heat emanating from the surface of said bath,
 (iii) directing a stream of warm gas over the solder side of the board at a position away from the hot molten solder bath,
(c) soldering the solder junctions on the board by immersing the solder side of the board into the surface of a hot molten solder bath by sequentially:
 (i) immersing a first edge of the board into the surface of the solder bath,
 (ii) lowering the remainder of the board into the surface of the solder bath,
 (iii) lifting the board from the surface of said bath at an angle to said surface to drain excess hot molten solder from the board.

13. A process according to claim 12 wherein the solder flux coating is applied to the solder side of the board with a flux foam.

14. The process according to claim 12 wherein the solder flux coating is applied to the solder side of the board with a flux spray.

15. The process according to claim 12 wherein the board is oscillated in the solder bath before the board is lifted from the solder bath.

16. A process for soldering circuit boards comprising the steps of:
(a) transporting a circuit board to a fluxing zone and applying a solder flux coating on a solder side of the board;
(b) transporting the board to a heating zone and at least partially drying the flux coating by directing a stream of warm gas over the solder side of the board;
(c) transporting the board to a soldering zone and positioning the solder side of the board over the surface of a hot molten solder bath to preheat the board with the heat emanating from the surface of said bath;
(d) transporting the board back to said heating zone and directing a stream of warm gas over the solder side of the board to dry the flux coating;
(e) transporting the board to the soldering zone and soldering the solder junctions on the board by sequentially:
 (i) immersing the solder side of the board into the surface of the hot molten solder bath, commencing with a first edge of the board,
 (ii) lowering the remainder of the board into the surface of the solder bath, and
 (iii) lifting the board from the surface of said bath at an angle to said surface to permit excess hot molten solder to drain from the board.

17. A process according to claim 16 wherein the solder flux coating is applied to the solder side of the board with a flux foam.

18. The process according to claim 16 wherein the solder flux coating is applied to the solder side of the board with a flux spray.

19. The process according to claim 12 wherein the board is oscillated in the solder bath before the board is lifted from the solder bath.

20. A process for soldering circuit boards comprising the steps of:
(a) transporting a carrier board at a fluxing elevation from a feed zone to a fluxing zone wherein a solder flux coating is applied to the solder side of the board;
(b) transporting the board from the flux zone to a heating zone at said fluxing elevation wherein a stream of warm gas is directed against the solder side of the board;

(c) transporting the board from the heating zone to a soldering zone at said fluxing elevation wherein the solder side of the board is preheated with the heat emanating from the surface of a hot molten solder bath;

(d) raising the carrier board from the fluxing elevation to a higher home elevation;

(e) transporting the board back from the solder zone to the heating zone at said home elevation to complete the drying of the flux coating by directing a stream of warm gas against the solder side of the board;

(f) transporting the board back from the heating zone back to the soldering zone at the home elevation;

(g) soldering the solder junctions on the board by lowering the board to a soldering elevation to immerse the solder side of the board into the surface of the hot molten solder bath by sequentially:
  (i) immersing a first edge of the board into the surface of said bath,
  (ii) lowering the remainder of the board into the surface of said bath,
  (iii) lifting the board from the surface of the solder bath to said home elevation at an angle to the surface of the solder bath to drain excess hot molten solder from the board; and (h) transporting the board from the solder zone to the feed zone at said home elevation so that the board during transportation clears the fluxing zone, heating zone and soldering zone.

21. A circuit board soldering apparatus comprising the following elements:

(a) a longitudinal base unit having two longitudinally extending sides connected to a first end and an opposing second end, a top portion connected to and bounded by said sides and ends with an open longitudinal central cavity, and two spaced apart parallel longitudinally extending rails mounted on the top portion on opposing sides of said central cavity;

(b) a foam means for generating a flux foam standing wave mounted in said central cavity approximately midway between said ends for applying a flux coating to the solder side of a circuit board;

(c) a heated solder pot mounted in said central cavity approximate said second end to hold a hot, molten solder bath for soldering the solder side of the circuit board;

(d) an air knife means for generating a warm air stream mounted in said central cavity between said foam means and said solder pot for drying a flux coating on the circuit board;

(e) a powered, wheeled circuit board transport adaped to ride on said rails to carry a circuit board from the first end across the foam means and the air knife means to the second end over said solder pot and back again;

(f) two powered cam means laterally mounted in said transport, said cam means rotatable to a high home position, a medium fluxing position and a low soldering position, said cam means adapted to carry and vertically move a circuit board carrier to a high home position, a medium fluxing position and a low soldering position;

(g) first sensing means to detect the position of said transport, said first sensing means detecting the position of said transport when it is positioned at the first end, at a location between said first end and said air knife means, and at the second end over said solder pot;

(h) second sensing means to detect the position of each of said cam means, said second means detecting the position of each of said cam means when said cam means are in a high home position, a medium fluxing position and a low soldering position;

(i) control means connected to said first and second sensing means to receive signals therefrom and connected to said powered transport and said powered cam means to send control signals thereto, said control means upon being actuated:
  (1) in a first step commands said transport to move to said second end to a position over the solder pot with said cams in a medium fluxing position to apply a flux coating to the circuit board at the foam means, to predry the flux coating at the air knife means and to preheat the board over the solder pot, and then commands said cam means to move said carrier to a high home position;
  (2) in a second step commands said transport to move from the second end towards the first end, to a position between the first end and said air knife means to dry the flux coating at said air knife means,
  (3) in a third step commands said transport to move from the position between the first end and said air knife means to said second end to a position over said solder pot, and then commands said cam means to move said carrier to a low soldering position to solder the board in the hot molten solder bath for a predetermined length of time, and then commands said cam means to move said carrier to a high home position to drain off the excess hot molten solder from the board and lift the board from the solder bath, and
  (4) and in a fourth step, commands said transport to move to said first end, and then commands said cam means to move said carrier to a medium fluxing position when the transport arrives back at said first end; and (j) said control means being connected to the air knife means for energizing said air knife means when said transport moves from said first end to said second end and passes said air knife means during said first step, and when said transport moves from said second end to a position between said first end and said air knife means and back to said second end during said second and third steps.

22. The circuit board soldering apparatus of claim 21 wherein said control means is a programmable microprocessor chip programmed with a master residence program adapted to receive a subsidiary overlay program to monitor and control the temperature of said solder pot and user definable process variables to station said transport over the solder pot for a predetermined time to solder the circuit board, to lift the soldered circuit board from the solder bath at an angle thereto at a predetermined speed to drain excess hot molten solder from the solder board, and to preheat the circuit board.

* * * * *

UNITED STATES PATENT AND TRADEMARK OFFICE
CERTIFICATE OF CORRECTION

PATENT NO. : 4,637,541

DATED : January 20, 1987

INVENTOR(S) : Michael W. Tanny

It is certified that error appears in the above-identified patent and that said Letters Patent is hereby corrected as shown below:

Title page:

[73] Assignee: delete "Unit Industries, Inc." and insert -- Unit Design, Inc. --

Signed and Sealed this

Twenty-third Day of August, 1988

Attest:

DONALD J. QUIGG

*Attesting Officer*   *Commissioner of Patents and Trademarks*